United States Patent
Kabutoya

(10) Patent No.: US 12,382,646 B2
(45) Date of Patent: Aug. 5, 2025

(54) SEMICONDUCTOR DEVICE AND METHOD FOR MANUFACTURING SEMICONDUCTOR DEVICE

(71) Applicant: KYOCERA Corporation, Kyoto (JP)

(72) Inventor: Shingo Kabutoya, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 404 days.

(21) Appl. No.: 17/910,046

(22) PCT Filed: Apr. 22, 2021

(86) PCT No.: PCT/JP2021/016318
§ 371 (c)(1),
(2) Date: Sep. 8, 2022

(87) PCT Pub. No.: WO2021/215503
PCT Pub. Date: Oct. 28, 2021

(65) Prior Publication Data
US 2023/0101385 A1    Mar. 30, 2023

(30) Foreign Application Priority Data

Apr. 24, 2020 (JP) ................. 2020-077274

(51) Int. Cl.
*H10D 8/60* (2025.01)
*H10D 8/01* (2025.01)

(52) U.S. Cl.
CPC ............ *H10D 8/605* (2025.01); *H10D 8/051* (2025.01)

(58) Field of Classification Search
CPC ........... H01L 29/8725; H01L 29/66143; H01L 29/47; H01L 29/0657; H01L 29/417; H01L 29/66212; H01L 29/872; H01L 21/329; H01L 29/48; H01L 29/86
See application file for complete search history.

(56) References Cited

U.S. PATENT DOCUMENTS

| | | |
|---|---|---|
| 2007/0145429 A1 | 6/2007 | Francis et al. |
| 2008/0083966 A1 | 4/2008 | Oonishi |
| 2010/0200910 A1 | 8/2010 | Yedinak et al. |

FOREIGN PATENT DOCUMENTS

| | | | |
|---|---|---|---|
| CN | 107293574 A | * 10/2017 | ......... H01L 29/0684 |
| CN | 108962972 A | 12/2018 | |
| JP | 2008-034572 A | 2/2008 | |
| JP | 2009-521816 A | 6/2009 | |
| JP | 2012-009756 A | 1/2012 | |
| KR | 20060134319 A | 12/2006 | |
| WO | 2007/075996 A1 | 7/2007 | |

* cited by examiner

*Primary Examiner* — Mohammad A Rahman
(74) *Attorney, Agent, or Firm* — Volpe Koenig

(57) ABSTRACT

A semiconductor device includes: a semiconductor layer including a trench; an insulating film covering an inner surface of the trench; a conductor embedded in the trench covered with the insulating film; and a Schottky junction layer. A Schottky junction is formed by the Schottky junction layer and a region being part of a semiconductor layer surface and being adjacent to the trench. A surface of the conductor is located at an elevation lower than the surface of the semiconductor layer. The semiconductor layer surface includes a sloping portion adjacent to an inner wall surface of the trench. The sloping portion has a downward gradient that is steeper in a region closer to the inner wall surface.

5 Claims, 5 Drawing Sheets

SEMICONDUCTOR DEVICE AND METHOD FOR MANUFACTURING SEMICONDUCTOR DEVICE

TECHNICAL FIELD

The present disclosure relates to a semiconductor device and a method for manufacturing a semiconductor device.

BACKGROUND OF INVENTION

Japanese Unexamined Patent Application Publication No. 2012-9756 describes manufacturing a semiconductor device having a Schottky junction. Manufacturing the semiconductor device involves: forming an insulating film on a surface of a semiconductor layer including a trench; embedding a conductor in the trench; exposing a region being part of the surface of the semiconductor layer and being adjacent to the trench by etching the insulating film away from the region; and forming a Schottky junction on the region in the surface of the semiconductor layer.

The insulating film and the conductor layer of the semiconductor layer disclosed in Japanese Unexamined Patent Application Publication No. 2012-9756 each have an upper surface that is recessed in an opening at an upper end of the trench, and the upper surface of the insulating film, the upper surface of the conductor, and the surface of the trench are covered with a barrier metal.

SUMMARY

According to an aspect of the present disclosure, a semiconductor device includes a semiconductor layer, an insulating film, a conductor, and a Schottky junction layer. The semiconductor layer includes a trench. An inner surface of the trench is covered with the insulating film. The conductor is embedded in the trench covered with the insulating film. A Schottky junction is formed by the Schottky junction layer and a region being part of a surface of the semiconductor layer and being adjacent to the trench. A surface of the conductor is located at an elevation lower than the surface of the semiconductor layer. The surface of the semiconductor layer includes a sloping portion adjacent to an inner wall surface of the trench. The sloping portion has a downward gradient that is steeper in a region closer to the inner wall surface.

According to another aspect of the present disclosure, a method for manufacturing a semiconductor device includes: forming an insulating film on a surface of a semiconductor layer including a trench; embedding a conductor in the trench; exposing a region being part of a surface of the semiconductor layer and being adjacent to the trench by etching the insulating film away from the region; and forming a Schottky junction on the region in the surface of the semiconductor layer. In the etching the insulating film, an upper end face of the insulating film covering an inner wall surface of the trench is lowered beyond the surface of the semiconductor layer, and the radius of curvature of a corner defined by the surface of the semiconductor layer and the inner wall surface is increased by anisotropic etching.

DESCRIPTION OF EMBODIMENTS

Hereinafter, an embodiment of the present disclosure will be described with reference to the accompanying drawings.

[Semiconductor Device]

Figure 1:
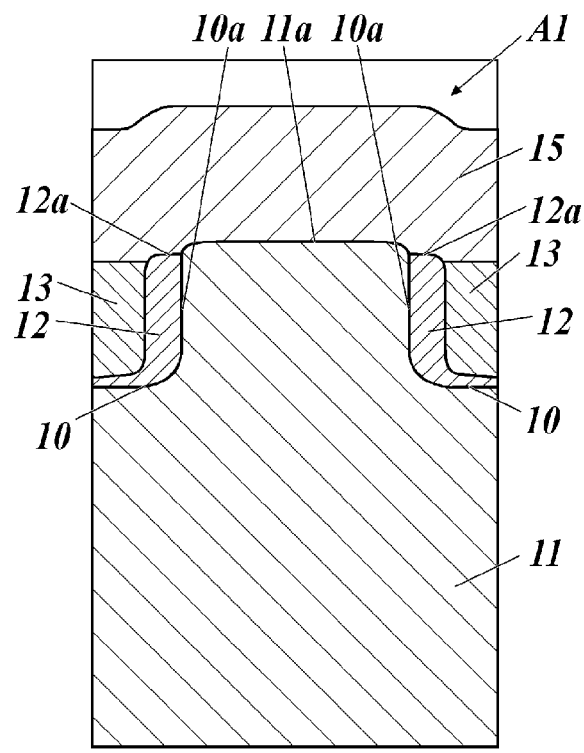
FIG. 1 is a schematic sectional view of a semiconductor device according to an embodiment of the present disclosure.

Referring to FIG. 1, a semiconductor device A1 according to an embodiment of the present disclosure includes a semiconductor layer 11, an insulating film 12, a conductor 13, and a Schottky junction layer 15. The semiconductor layer 11 includes a trench 10. An inner surface 10a of the trench 10 is covered with the insulating film 12. The conductor 13 is embedded in the trench 10 covered with the insulating film 12. A Schottky junction is formed by the Schottky junction layer 15 and a region being part of a semiconductor layer surface 11a and being adjacent to the trench 10.

The conductor 13 may be polysilicon. The semiconductor layer 11 may be a silicon layer. The insulating film 12 may be a silicon oxide film. The Schottky junction layer 15 is made of a barrier metal, such as nickel, molybdenum, or platinum.

Figure 2:
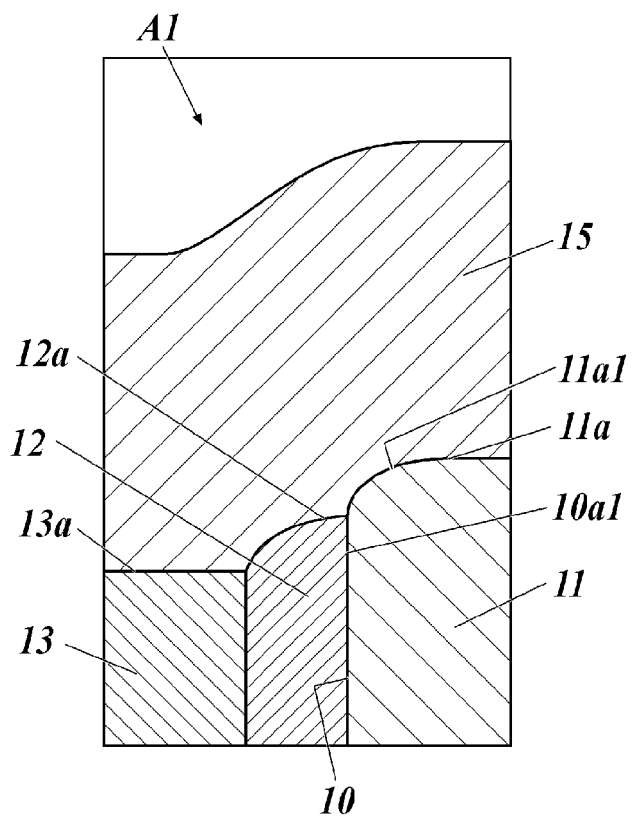
FIG. 2 is a partial enlargement of FIG. 1.

As can be seen in FIG. 2, a surface 13a of the conductor 13 is located at an elevation lower than the semiconductor layer surface 11a.

The semiconductor layer surface 11a includes a sloping portion 11a1, which is adjacent to an inner wall surface 10a1 of the trench 10. The sloping portion 11a1 has a downward gradient that is steeper in a region closer to the inner wall surface 10a1. Thus, a surface of an underlayer of the Schottky junction layer 15 offers improved step coverage. During the application of a reverse voltage, this feature leads to a reduction in the concentration of electric field and, by extension, to a reduction in the concentration of stress, and the leakage current is kept low accordingly.

The insulating film 12 covering the inner wall surface 10a1 has an upper end face 12a. The upper end face 12a and the sloping portion 11a1 extend with no gap therebetween and slope in the same direction. In other words, the sloping portion 11a1 and the upper end face 12a slope down when a succession of constituent elements is traced from the midsection of the semiconductor layer surface 11a to the surface 13a of the conductor 13. Thus, the surface of the underlayer of the Schottky junction layer 15 offers improved step coverage in a region around the Schottky junction. During the application of a reverse voltage, this feature leads to a reduction in the concentration of electric field and, by extension, to a reduction in the concentration of stress, and the leakage current is kept low accordingly.

The sloping portion 11a1 is a protruding curved surface whose angle of slope increases with increasing proximity to the inner wall surface 10a1. The angle of slope is formed by a line tangent to the sloping portion 11a1 in a section (see FIGS. 1 and 2) taken along a line perpendicular to the inner wall surface 10a1 and a line tangent to a top portion (a flat portion) of the semiconductor layer surface 11a. Thus, the surface of the underlayer of the Schottky junction layer 15 offers improved step coverage. During the application of a reverse voltage, this feature leads to a reduction in the concentration of electric field and, by extension, to a reduction in the concentration of stress, and the leakage current is kept low accordingly.

The upper end face 12a of the insulating film 12 covering the inner wall surface 10a1 is a protruding curved surface whose angle of slope increases with increasing proximity to the conductor 13. Thus, the surface of the underlayer of the Schottky junction layer 15 offers improved step coverage in the region around the Schottky junction. During the application of a reverse voltage, this feature leads to a reduction in the concentration of electric field, and by extension, to a reduction in the concentration of stress, and the leakage current is kept low accordingly.

[Method for Manufacturing Semiconductor Device]

The following describes an example method for manufacturing the semiconductor device A1.

(Step of Forming Insulating Film and Embedding Conductor)

Figure 3:
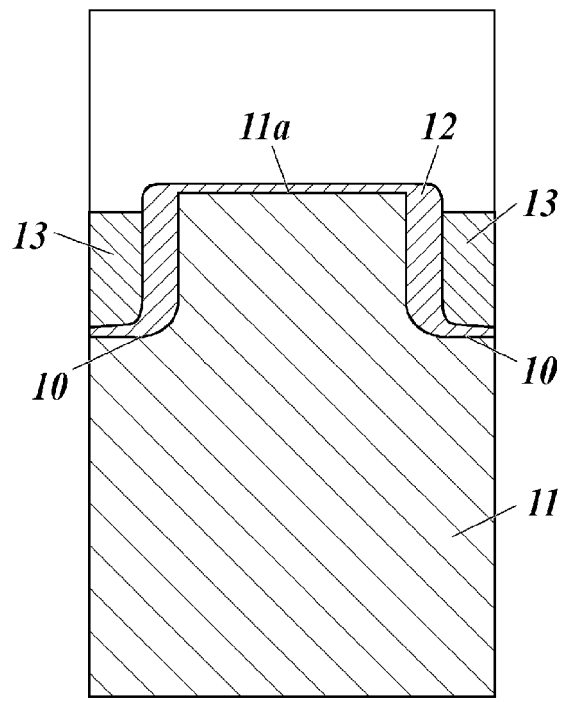
FIG. 3 is a schematic sectional view for explanation of a manufacturing process step involved in the production of the semiconductor device illustrated in FIG. 1.
Figure 4:
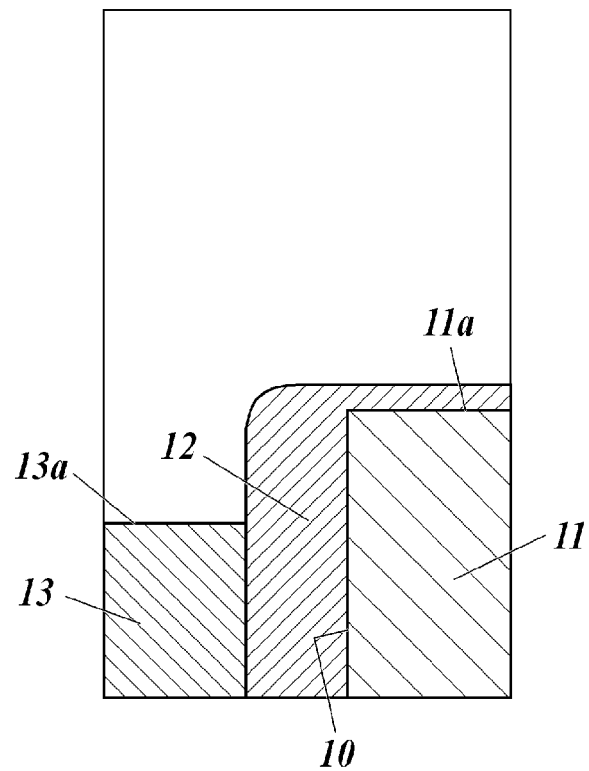
FIG. 4 is a partial enlargement of FIG. 3.

The insulating film 12 is formed on the surface of the semiconductor layer 11 having the trench 10, and the conductor 13 is then embedded in the trench 10 (see FIGS. 3 and 4). The surface of the conductor 13 is then etched to lower the surface 13a of the conductor 13 beyond the semiconductor layer surface 11a.

(Step of Etching Insulating Film)

Figure 5:
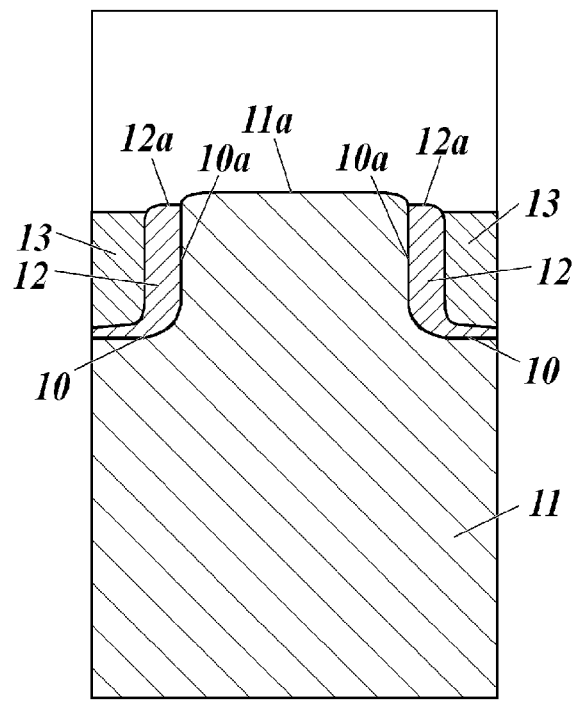
FIG. 5 is a schematic sectional view for explanation of a manufacturing process step subsequent to the manufacturing process step that will be described with reference to FIG. 3.
Figure 6:
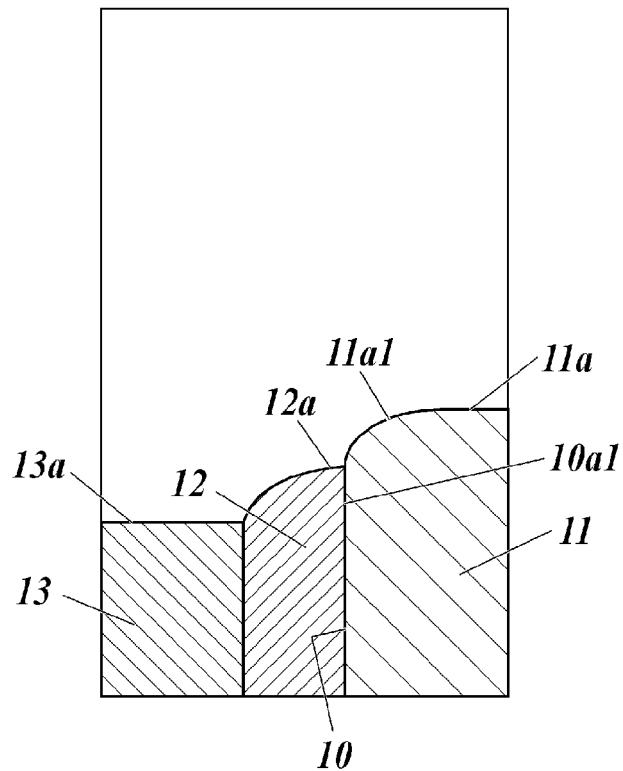
FIG. 6 is a partial enlargement of FIG. 5.

The insulating film 12 is then etched away from a region being part of the semiconductor layer surface 11a and being adjacent to the trench 10 such that the semiconductor layer surface 11a is exposed to view (see FIGS. 5 and 6). The insulating film 12 is overetched to ensure that the semiconductor layer surface 11a is sufficiently exposed to view. That is, the upper end face 12a of the insulating film 12 covering the inner wall surface 10a1 of the trench 10 is etched deeper. As can be seen in FIGS. 5 and 6, the upper end face 12a is located at elevations lower than the semiconductor layer surface 11a. It is to be ensured that the insulating film on the semiconductor layer surface 11a is removed to a sufficient degree. With regard to the semiconductor device and the method for manufacturing the semiconductor device, the downward direction is herein regarded as meaning the direction in which the trench 10 in the surface of the semiconductor layer 11 is hollowed out, and the upward direction is herein regarded as meaning the reverse of it. These directions are not to be taken to mean the up-and-down direction (the direction of gravity) at the time of manufacturing of the semiconductor device or during periods of use of the semiconductor device.

In the etching the insulating film 12, the upper end face 12a of the insulating film 12 covering the inner wall surface 10a1 of the trench 10 is lowered beyond the semiconductor layer surface 11a, and the radius of curvature of the corner defined by the semiconductor layer surface 11a and the inner wall surface 10a1 is increased by anisotropic etching.

The semiconductor layer 11 made of silicon and the insulating film 12 made of silicon oxide may be etched by using $CF_4$, $CF_3$, or any other etching gas that enables highly anisotropic etching.

As the etching progresses, the semiconductor layer surface 11a is exposed at the surface of the insulating film 12 such that the corner defined by the semiconductor layer surface 11a and the inner wall surface 10a1 is exposed to the etching gas. The corner subjected to the highly anisotropic etching is etched both vertically and laterally. Consequently, the corner is formed into the sloping portion 11a1, which is in the form of a curved surface as mentioned above. The other region subjected to the anisotropic etching is formed into the upper end face 12a, which is in the form of a curved surface as mentioned above.

(Step of Forming Schottky Junction)

The etching is followed by the step of forming a Schottky junction, where the Schottky junction layer 15 is formed on the semiconductor layer surface 11a. The semiconductor device A1 obtained as above has the structure illustrated in FIGS. 1 and 2. The semiconductor device A1 undergoes some other steps before it is in finished form.

[Comparison of Reverse Characteristics]

Figure 7:
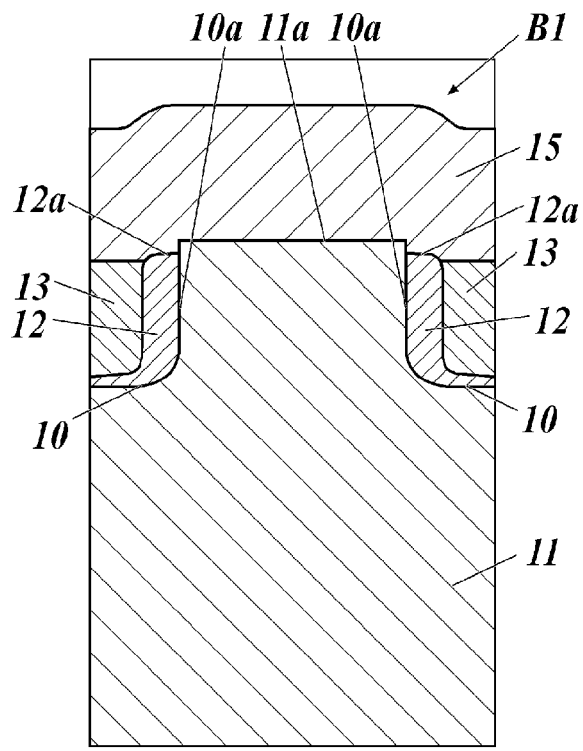
FIG. 7 is a schematic sectional view of a semiconductor device in Comparative Example.

FIG. 7 illustrates a semiconductor device B1 in Comparative Example. The semiconductor device B1 in Comparative Example differs from the semiconductor device A1 according to the present embodiment in the following respects only: (i) the semiconductor layer surface 11a does not include the sloping portion 11a1; and (ii) the semiconductor layer surface 11a is flat.

Figure 8:
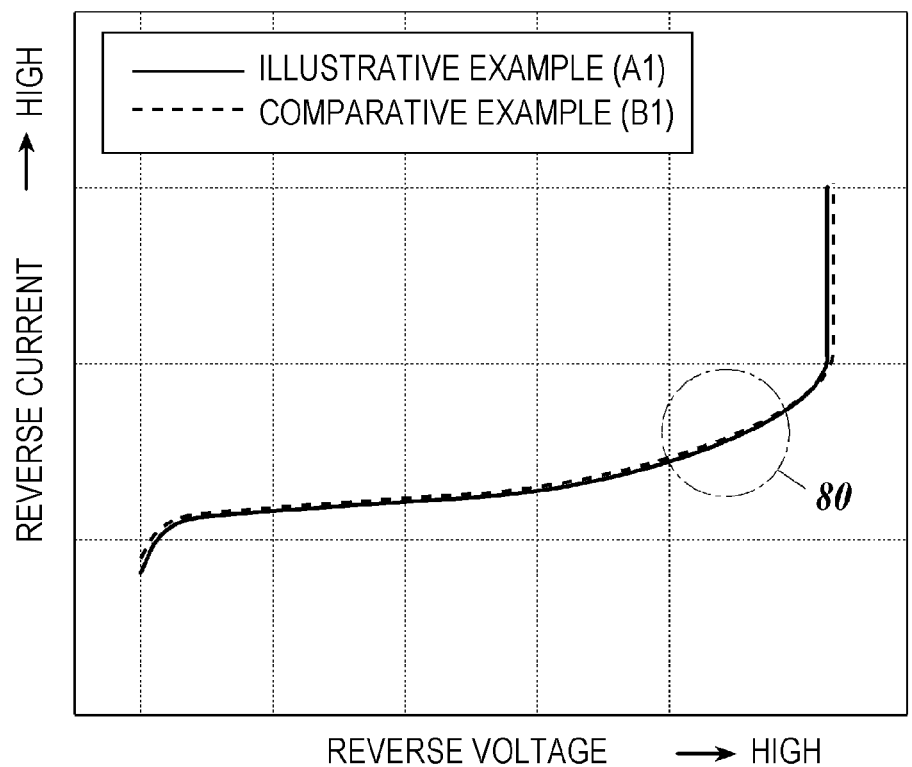
FIG. 8 illustrates the voltage-current characteristics measurements under reverse bias and graphically represents the characteristics in an illustrative example and the characteristics in Comparative Example.
Figure 9:
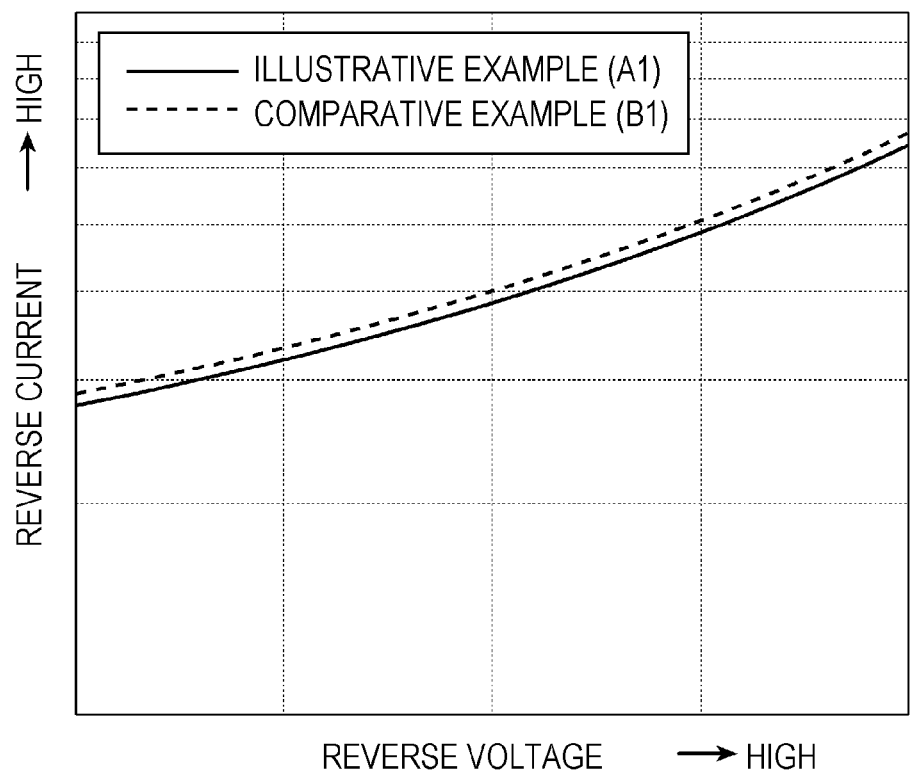
FIG. 9 is a partial enlargement of FIG. 8.

Simulations were conducted on the semiconductor device A1 according to the present embodiment and the semiconductor device B1 in Comparative Example under the same condition. FIG. 8 illustrates the results of the voltage-current characteristics measurements under reverse bias. FIG. 9 is a partial enlargement of FIG. 8. The part presented in FIG. 9 is denoted by 80 in FIG. 8.

As can be seen in FIGS. 8 and 9, the reverse current was lower in the semiconductor device A1 according to the present embodiment than in the semiconductor device B1 in Comparative Example; that is, the semiconductor device A1 exhibited improved reverse characteristics.

The results revealed that the present embodiment produced the following effects: the surface of the underlayer of the Schottky junction layer 15 offered improved step coverage; and during the application of a reverse voltage, this feature led to a reduction in the concentration of electric field and, by extension, to a reduction in the concentration of stress, and the leakage current was kept low accordingly.

[Conclusion and Notes]

The semiconductor device according to an embodiment of the present disclosure offers the following advantages. The leakage current that flows through an edge portion of the Schottky junction during the application of a reverse voltage is kept low.

The insulating film on the semiconductor layer surface 11a is removed to a sufficient degree such that the semiconductor device exhibits favorable characteristics in relation to the Schottky junction.

The manufacturing method according to an embodiment of the present disclosure enables manufacturing of a semiconductor device that offers the following advantages. The surface of the underlayer of the Schottky junction layer 15 offers improved step coverage. During the application of a reverse voltage, the leakage current is kept low accordingly.

The insulating film on the semiconductor layer surface 11a is removed to a sufficient degree such that the semiconductor device exhibits favorable characteristics in relation to the Schottky junction.

An embodiment of the present disclosure has been described herein above as an example. It is to be appreciated that the present disclosure may be implemented in various forms. One or more of the constituent elements may be omitted, replaced with another, or varied within a range not departing from the gist of the invention.

INDUSTRIAL APPLICABILITY

The present disclosure is applicable to a semiconductor device and a method for manufacturing a semiconductor device.

REFERENCE SIGNS 10 trench
11 semiconductor layer
11a semiconductor layer surface
11a1 sloping portion
12 insulating film
13 conductor
15 Schottky junction layer
A1 semiconductor device

The invention claimed is:

1. A semiconductor device, comprising:
a semiconductor layer comprising a trench;
an insulating film covering an inner surface of the trench;
a conductor embedded in the trench covered with the insulating film; and
a Schottky junction layer, a Schottky junction being formed by the Schottky junction layer and a region being part of a surface of the semiconductor layer and being adjacent to the trench, wherein
a surface of the conductor is located at an elevation lower than the surface of the semiconductor layer, and
a portion of the region of the surface of the semiconductor layer comprises a sloping portion, the sloping portion having an angle of slope that increases with increasing proximity to the insulating film.

2. The semiconductor device according to claim 1, wherein an upper end face of the insulating film covering the inner wall surface and the sloping portion extend with no gap therebetween and slope in same direction.

3. The semiconductor device according to claim 1, wherein the sloping portion is a protruding curved surface whose angle of slope increases with increasing proximity to the inner wall surface, where the angle of slope is formed by a line tangent to the sloping portion in a section taken along a line perpendicular to the inner wall surface and a line tangent to a top portion of the surface of the semiconductor layer.

4. The semiconductor device according to claim 2, wherein the upper end face of the insulating film covering the inner wall surface is a protruding curved surface whose angle of slope increases with increasing proximity to the conductor.

5. A method for manufacturing a semiconductor device, the method comprising:
forming an insulating film on a surface of a semiconductor layer comprising a trench; embedding a conductor in the trench;
exposing a region being part of a surface of the semiconductor layer and being adjacent to the trench by etching the insulating film away from the region; and
forming a Schottky junction on the region in the surface of the semiconductor layer, wherein
in the etching the insulating film, an upper end face of the insulating film covering an inner wall surface of the trench is lowered beyond the surface of the semiconductor layer, and a radius of curvature of a corner defined by the surface of the semiconductor layer and the inner wall surface is increased by anisotropic etching.

\* \* \* \* \*